United States Patent
Harmer et al.

[11] Patent Number: 6,048,394
[45] Date of Patent: Apr. 11, 2000

[54] METHOD FOR GROWING SINGLE CRYSTALS FROM POLYCRYSTALLINE PRECURSORS

[75] Inventors: Martin P. Harmer, Emmaus; Helen M. Chan, Bethlehem, both of Pa.; Ho-Yong Lee, Seoul, Rep. of Korea; Adam M. Scotch, Easton; Tao Li, Bethlehem, both of Pa.; Frank Meschke, Juelich, Germany; Ajmal Khan, Lansdale, Pa.

[73] Assignee: Competitive Technologies of PA, Inc., Fairfield, Conn.

[21] Appl. No.: 09/134,455

[22] Filed: Aug. 14, 1998

Related U.S. Application Data

[60] Provisional application No. 60/058,912, Aug. 14, 1997.

[51] Int. Cl.[7] .................................................. C30B 25/04
[52] U.S. Cl. .......................... 117/8; 117/2; 117/3; 117/7
[58] Field of Search ................................. 117/2, 3, 7, 8

[56] References Cited

U.S. PATENT DOCUMENTS

| | | | |
|---|---|---|---|
| 4,339,301 | 7/1982 | Matsuzawa et al. | 156/603 |
| 4,519,870 | 5/1985 | Matsuzawa et al. | 156/603 |
| 4,900,393 | 2/1990 | Kugimiya et al. | 156/600 |
| 5,281,283 | 1/1994 | Tokunaga et al. | 148/33.3 |
| 5,304,226 | 4/1994 | Hasegawa et al. | 51/309 |

FOREIGN PATENT DOCUMENTS

| | | |
|---|---|---|
| 61-091091 | 5/1985 | Japan . |
| 60-195096 | 10/1985 | Japan . |
| 60-195097 | 10/1985 | Japan . |
| 61-146779 | 7/1986 | Japan . |
| 61-146780 | 7/1986 | Japan . |
| 63-035496 | 2/1988 | Japan . |

OTHER PUBLICATIONS

N. Yamamoto and S. Matsuzawa, "The Solid–Phase Epitaxial Growth Method," *Fine Ceramics*, ed., S. Saito, Ohmsha, Ltd., 1985, pp. 39–44.

T. Yamamoto and T. Sakuma, "Preparation of $BaTiO_3$ Single Crystals by Sintering," pp. 209–215, Proceedings of the $2^{nd}$ Japanese International SAMPE, Dec. 11–14, 1991.

T. Yamamoto and T. Sakuma, "Fabrication of Barium Titanate Single Crystals by Solid–State Grain Growth," Journal of the American Ceramic Society, 77'1', pp. 1107–1109, 1994.

*Primary Examiner*—Felisa Garrett
*Attorney, Agent, or Firm*—Michael R. Novack

[57] ABSTRACT

A method is disclosed for forming a single crystal relaxor based material, including the following steps: providing a seed single crystal plate, providing a first and second polycrystalline structure, bonding the top surface of the seed crystal plate to the outer surface of the first polycrystalline structure, bonding the bottom surface of the seed crystal plate to the outer surface of the second polycrystalline structure, and annealing the bonded structure.

8 Claims, 10 Drawing Sheets

METHOD FOR GROWING SINGLE CRYSTALS FROM POLYCRYSTALLINE PRECURSORS

RELATED APPLICATION

This application claims priority from U.S. Provisional Application Ser. No. 60/058,912 filed Aug. 14, 1997, and said U.S. Provisional Application is incorporated herein by reference.

This invention was made with U.S. government support awarded by the Office of Naval Research, Grant No. N00014-96-1-0627. The U.S. government has certain rights in this invention.

FIELD OF THE INVENTION

This invention relates to methods for growing single crystals from polycrystalline precursors, and more particularly to forming a single crystal relaxor based material.

BACKGROUND OF THE INVENTION

Recent developments have established that relaxor-based single crystal ferroelectrics possess enhanced performance characteristics compared to alternative polycrystalline forms. Single crystals of $Pb(Mg_{1/3}Nb_{2/3})O_3$ (PMN), $Pb(Zn_{1/3}Nb_{2/3})O_3$ (PZN), and their solid solutions with $PbTiO_3$ (PT) have been shown to exhibit E-field induced strains>1%, longitudinal coupling coefficients ($k_{33}$)>90%, piezoelectric coefficients ($d_{33}$)>2000 pC/N, and dielectric constants from 1000–5000 with low dielectric loss<1%. These properties demonstrate great potential for expanding existing ultrasonic transducer and actuator applications.

Although conventional high-temperature solution techniques are suitable for growing ceramic single crystals which melt incongruently, the growth rate is relatively slow and not readily transferable to large scale manufacturing.

SUMMARY OF THE INVENTION

A cost-effective method of fabricating single crystal relaxor-based ferroelectric materials has been developed. This method is particularly well suited to for applications that require complex shapes, such as 1-3 and 2-2 piezocomposites.

The procedure entails embedding or bonding a seed single crystal to a dense polycrystalline precursor and allowing the boundary to migrate through the polycrystal under the influence of grain boundary curvature. In a preferred embodiment, a second ceramic, having a melting point lower than the ferroelectric ceramic, is added to the polycrystalline precursor. Upon annealing the second phase forms a liquid phase throughout the polycrystalline matrix and around the seed. The presence of the "wetting" second phase in the matrix and around the growing single crystal has been shown to aid in the growth of the single crystal.

It has been suggested in the growth of both ferrite and barium titanate ceramic single crystals that a seed crystal can be bonded to a dense polycrystalline precursor. However, the present invention is not limited to dense polycrystalline precursors. Applicant is first to demonstrate that growth of single crystals from polycrystalline precursors can be achieved in relaxor-based ferroelectric materials. The present invention can be used to embed a single seed crystal in a green polycrystalline precursor as well as bonding a seed crystal to a dense polycrystalline precursor in a polycrystal/seed single crystal/polycrystal "sandwich" form. Moreover, to grow ceramic single crystals from polycrystalline precursors, different material systems behave differently in terms of polycrystal grain size, single crystal/grown crystal orientation, polycrystal/single crystal interface chemistry, polycrystal chemistry, thermal gradient across the polycrystal/single crystal interface and processing variables.

Preliminary results have established the feasibility of growing relaxor-based single crystals from polycrystalline precursors. Growth distances of embedded single crystals were on the order of a few millimeters.

It is an object of the present invention to provide an effective low cost manufacturing process for single crystal ferroelectric materials. It is another object of the present invention to increase the rate at which single crystals are manufactured from polycrystalline precursors.

Further features and advantages of the invention will become more readily apparent from the following detailed description when taken in conjunction with the accompanying drawings.

BRIEF DESCRIPTION OF THE DRAWINGS

FIG. 9 (a) is an image of a single crystal grown from seeded polycrystalline precursor in the presence of a wetting second phase, which has been annealed for 10 hrs. at 1150° C.

FIG. 9 (b) is a magnified image of the matrix portion of FIG. 9(a) showing wetting second phase.

FIG. 9 (c) is a magnified image of the grain boundary region of FIG. 9(a)

DETAILED DESCRIPTION

Seed single crystals (Pennsylvania State University) were embedded in PMN-35 mol % PT powder (TRS Ceramics, State College, Pa.) and cold isostatically pressed into 13 mm diameter compacts. The compacts were sintered and annealed at temperatures from 900 to 1200 C. for dwell times up to 140 hours under pressureless conditions. A double crucible arrangement was used with $PbZrO_3$ packing powder as a sacrificial material to suppress the volatilization of lead in the compacts.

Cross-sections of the annealed compacts were observed by optical microscopy and scanning electron microscopy (SEM). The samples were thermally etched for 1 h at 850° C. The theoretical density used for the PMN-35 mol % PT system was 8.0 g/cm³. The porosity of grown crystals and polycrystalline matrix was measured using a LECO 2001 image analysis system. The crystallographic orientation of the seeds and grown areas were determined using an electron backscattering diffraction system in the SEM. Kikuchi patterns were collected at 20 kV using a CCD-based detector system. The samples were carbon-coated and placed in the SEM with one of the straight edges of the grown single crystal in the horizontal position. The collected patterns were indexed, and the orientation of the crystal was determined with respect to the sample normal. High-quality patterns were obtained from both the seed crystals and the grown areas resulting in an accuracy of about ±1° in the orientations.

In order to get a fully dense matrix prior to crystal growth, seeded polycrystalline compacts of PMN-35% PT were hot-pressed from 900–1000° C. for 1–12 hours at 40 MPa. The samples were subsequently annealed under pressureless conditions to allow for crystal growth.

A top-seeded growth technique was also employed by bonding a seed single crystal to a dense compact and annealing. Mating surfaces of the compacts and seed single crystals were polished to a 1 μm finish.

Figure 1:
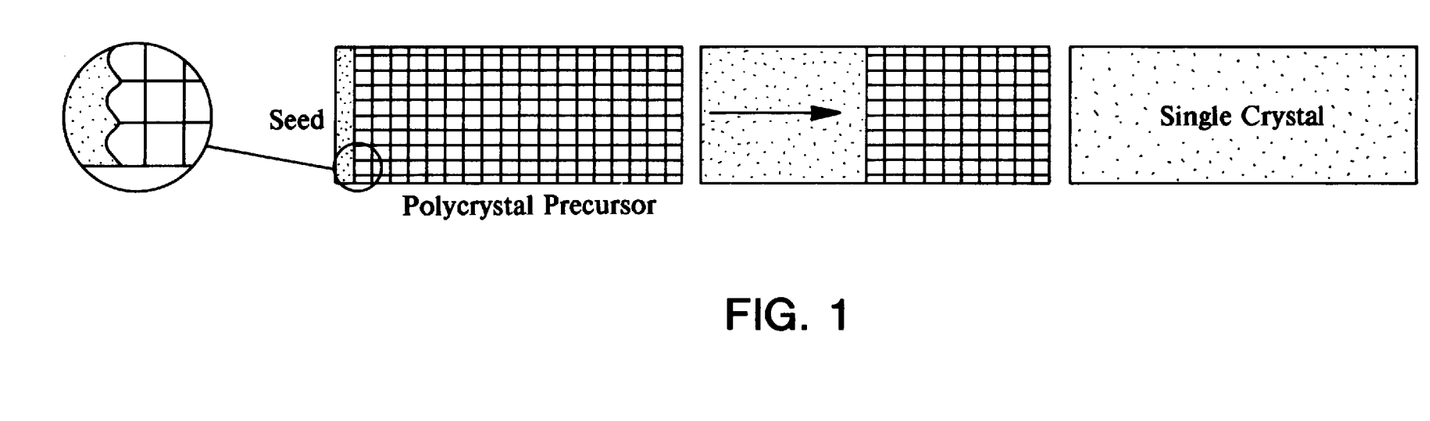
FIG. 1 is a schematic diagram illustrating the method of the present invention.

FIG. 1 illustrates the formation of the single crystal structure from the addition of a seed crystal to a polycrystalline precursor.

Figure 2:
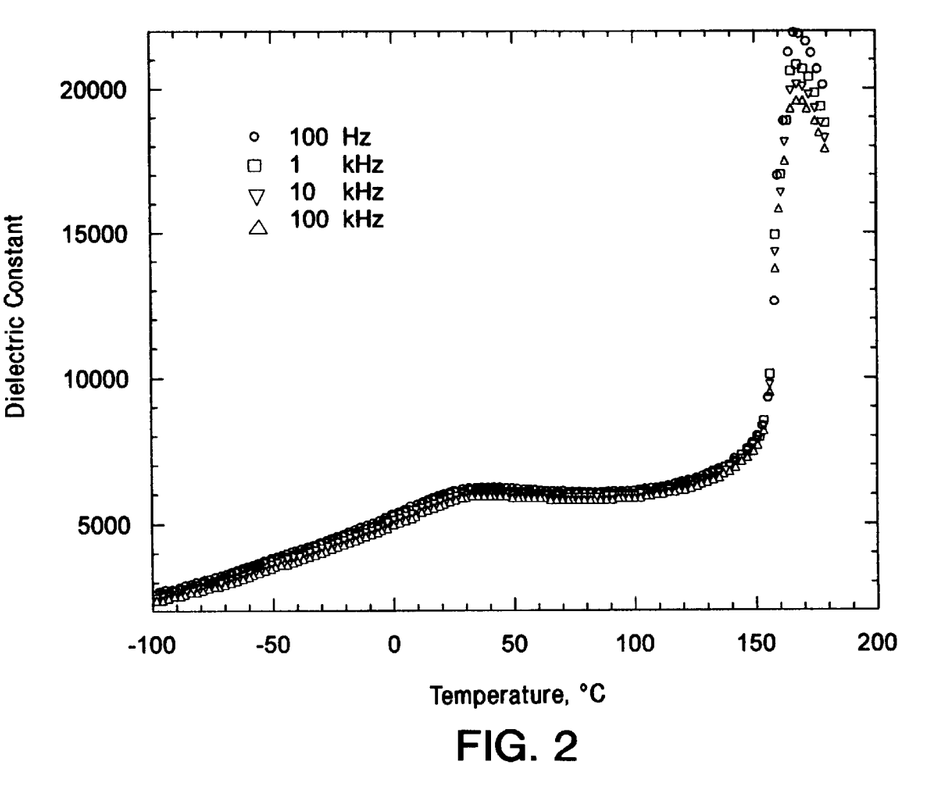
FIG. 2 is a graph showing the variation of dielectric constant with temperature.

FIG. 2 displays the change of the dielectric constant with temperature at frequencies of 100 Hz, 1 kHz, 10 kHz, and 100 KHz for the <100> oriented grown crystals. From the figure, the dielectric maximum temperature was 167° C. at 1 kHz, which coincides well with that of crystals grown by the flux method. After poling, the room temperature dielectric constant was 1950 at 1 kHz. The maximum dielectric constant observed was 21,000 (1 kHz), which is lower than the dielectric maximum of 32,000 for crystals grown by the flux method, probably due the existence of porosity.

Figure 3:
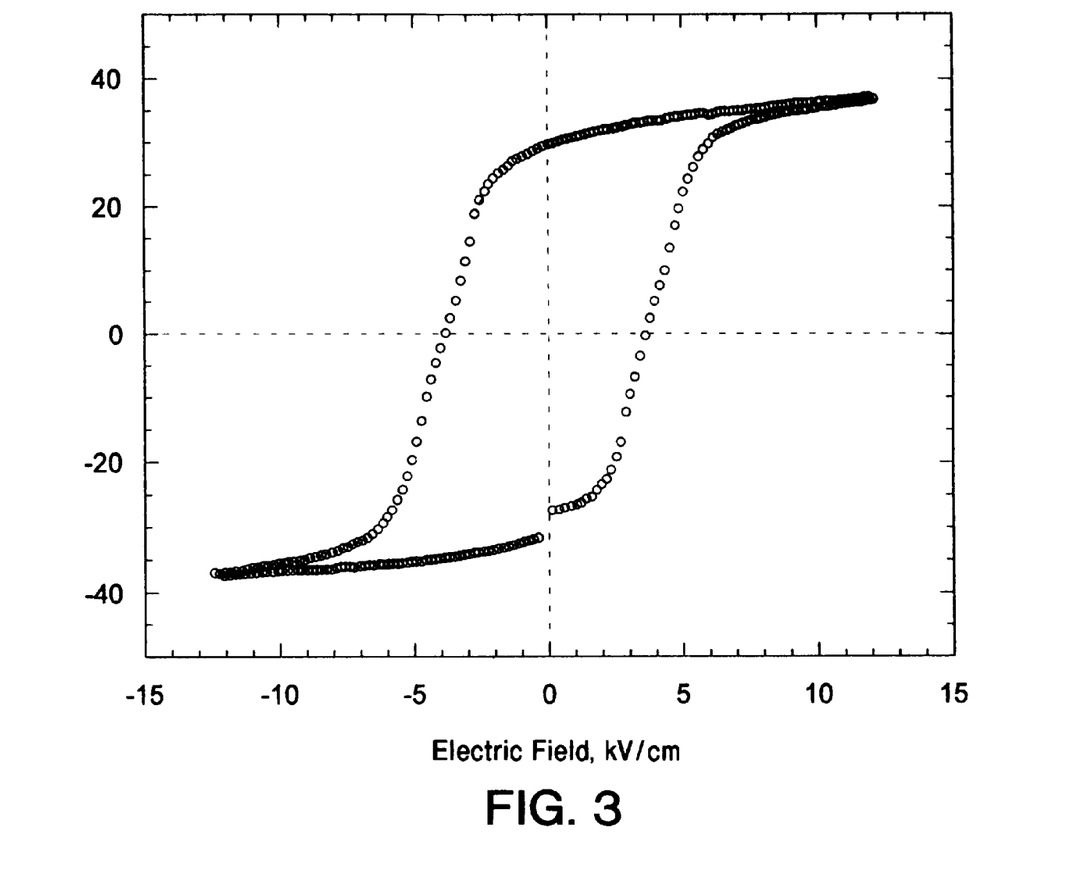
FIG. 3 is a graph showing polarization with respect to the E-Field curve for a PMN-PT sample.
Figure 4:
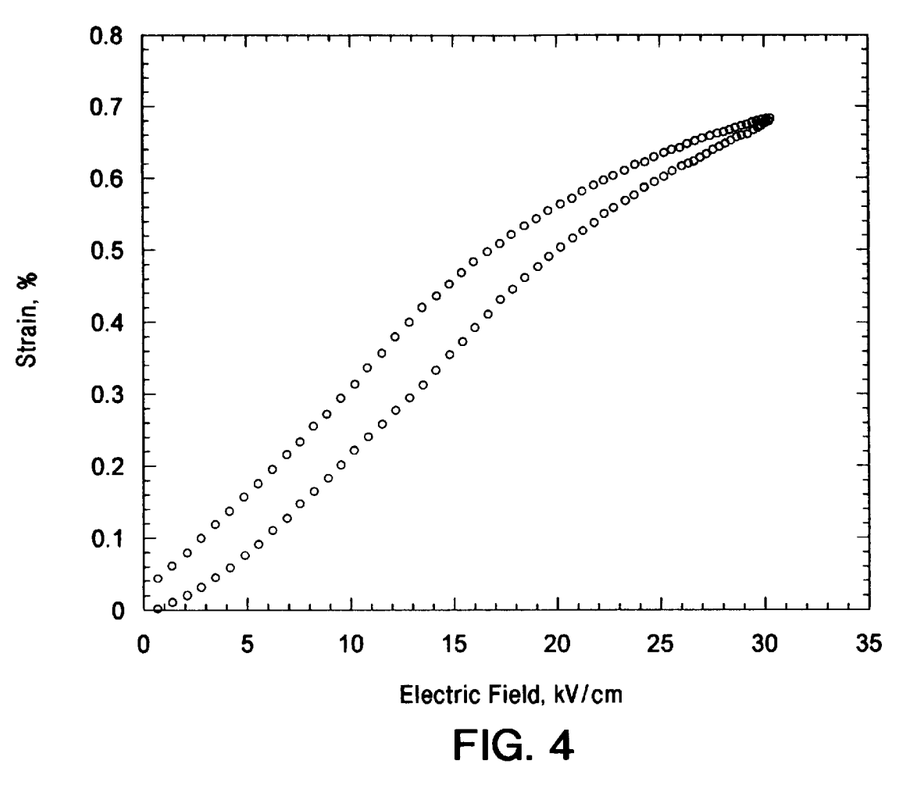
FIG. 4 is a graph showing strain with respect to E-field curve for a PMN-PT sample.

The <100> polarization behavior of the grown crystals under different electric fields is shown in FIG. 3. Remnant polarization ($P_r$) and coercive field ($E_c$) were 30 μC/cm² and 3.5 kV/cm, respectively. Subsequent unipolar strain behavior of poled samples at a maximum applied electric field of 30 μC/cm² is demonstrated in FIG. 4. A strain level as high as 0.68% was detected. The hysteresis observed in the figure is the result of electric-field-induced phase transformation as well as subsequent domain reorientation under bias, characteristics of crystal compositions lying on the MPB.

Figure 5:
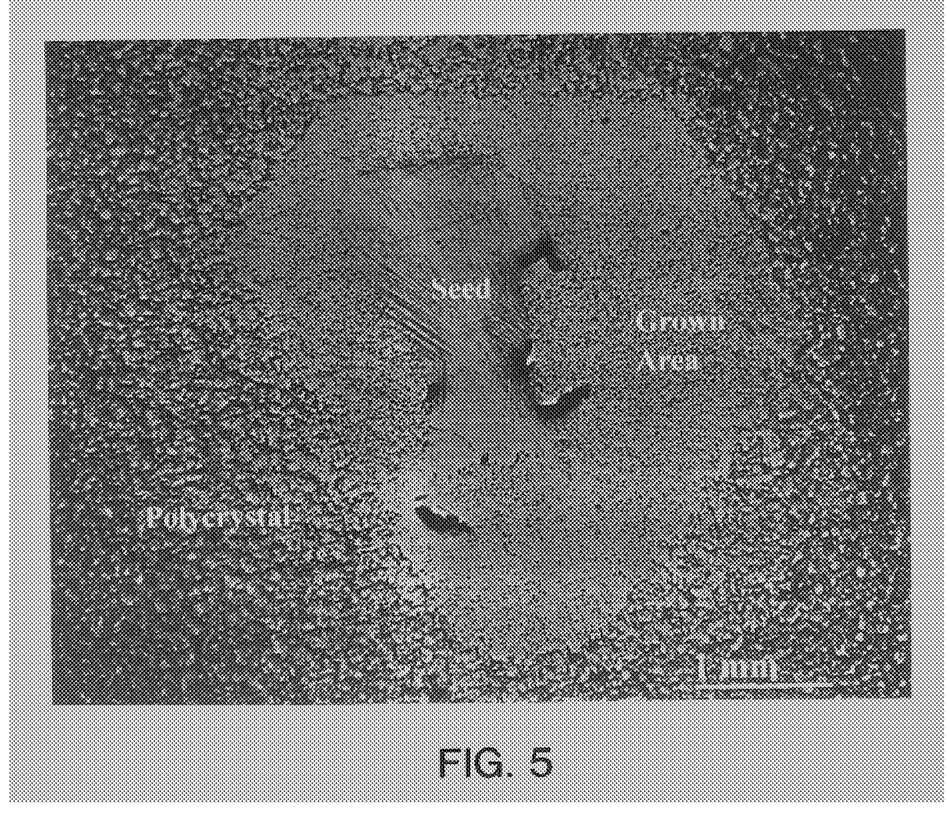
FIG. 5 is an image of the growth of a seed single crystal of PMN-PT into polycrystalline precursor after annealing at 1150° C. for 140 hours.

FIG. 5 shows the cross-section of a seed single crystal that has grown several millimeters into the polycrystalline matrix after annealing for 140 hours at 1150° C. in air under pressureless conditions. The motivation for embedding a seed in a polycrystalline matrix was to observe growth for all crystallographic orientations in a single sample. The directions for fast and slow crystal growth could then be examined effectively.

Figure 6A:
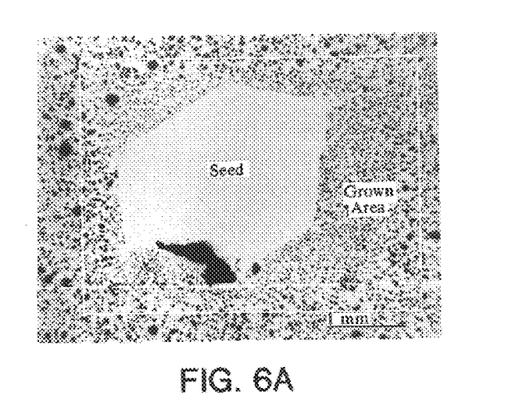
FIG. 6(a) is an image of a cross-section of seeded PMN-35 mol % PT compact after 16 hours at 1200° C.
Figure 7:
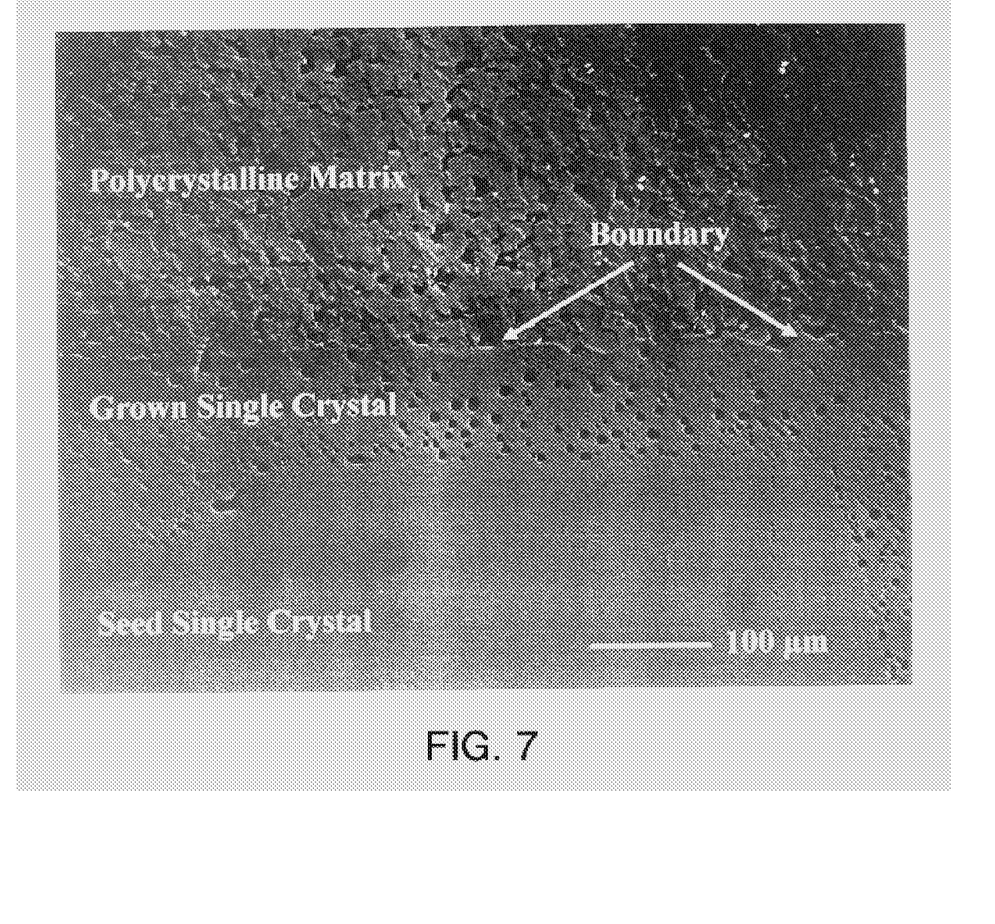
FIG. 7 is an image of a single-crystal/polycrystal interface of seeded PMN-PT sample after a pressureless annealing.

FIG. 6(a) shows a cross-section of a seeded PMN-35 mol % PT compact after annealing for 16 hours at 1200° C. under pressureless conditions. The grown single crystal exhibited a cubic morphology, as outlined with solid white in FIG. 6(a). The interface between the grown area and the polycrystalline matrix can be clearly distinguished by the shape of the porosity. The pores in the polycrystalline matrix are faceted, whereas in the grown single crystal, the pores are more spherical. The difference in pore morphology can be seen more distinctly at a higher magnification of the interface, as shown in FIG. 7.

Figure 6B:
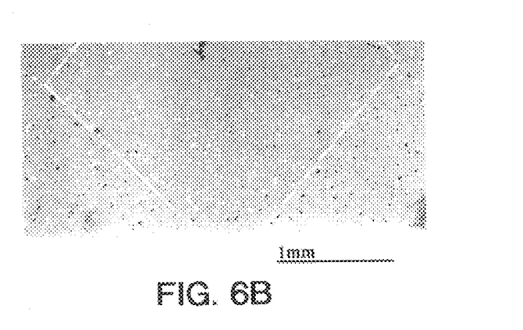
FIG. 6(b) is an image perpendicular cross-section taken at dashed line in (a) of FIG. 6(a).

FIG. 6(b) displays a second cross-section taken perpendicular to the polished surface at the dashed line in FIG. 6(a). FIGS. 5 and 6 support the feasibility of this procedure to grow single crystals and offer evidence that PMN-35 mol % PT single crystals exhibit cubic growth morphologies using polycrystalline precursors.

Figure 6C:
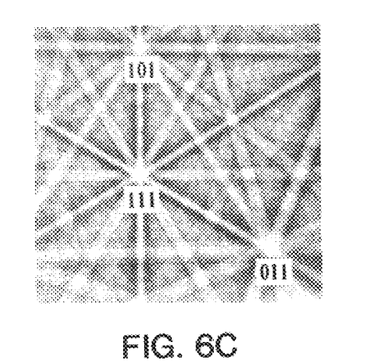
FIG. 6(c) Electron Backscatter Kikuchi Pattern of polished surface shown in (a) of FIG. 6 (a).
Figure 6D:
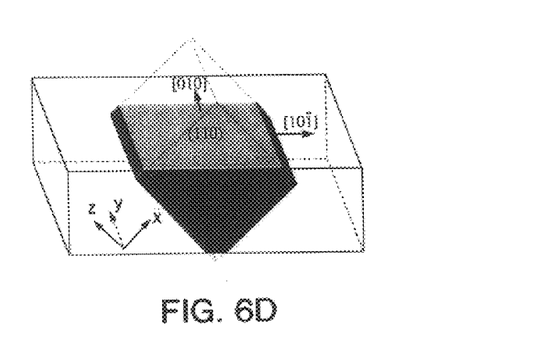
FIG. 6(d) is schematic of grown single crystal with crystallographic orientations determined from FIG. 6 (c).

The crystallographic orientations of the single crystal were determined using an electron backscatter diffraction technique in an SEM. FIG. 6(c) presents a Kikuchi pattern taken from the polished surface of the single crystal shown in FIG. 6(a). The primary poles were indexed and suggest a crystal structure that is nearly cubic. Applying the information from the Kikuchi pattern to the single crystal morphologies seen in FIGS. 6(a) and 6(b), a schematic diagram was constructed to illustrate the crystal directions (FIG. 6(d)). It is seen that <110> is a fast growth direction in PMN-35 mol % PT, and that <100> is slow. Since PMN-35 mol % PT prefers a near-cubic morphology <111> appears to be the fastest direction.

In general, the velocity of a grain boundary is directly proportional to both the boundary mobility, and the driving force for migration. An increase in either of these would thus enhance the growth rate of the crystal. Rodel and Glaeser reported that the mobility of an alumina single crystal boundary depends on the orientation of the single crystal. It has also been reported that the structure and chemistry of the boundary, and the processing temperature affect mobility.

Figure 8:
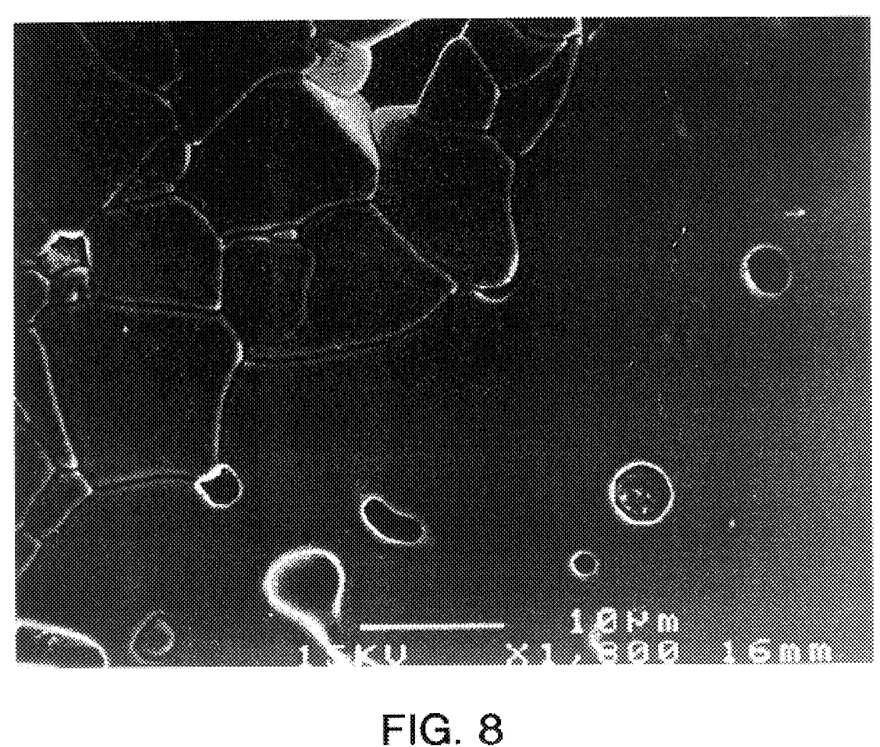
FIG. 8 is an image of a grown single crystal/polycrystal interface showing grain boundary curvature.

Since the driving force for migration originates from the local boundary curvature, reducing the grain size of the polycrystal can promote growth. This effect has been seen for single crystals of $BaTiO_3$ where more growth of the single crystal occurred in a fine-grained matrix. The single crystal/polycrystal interfaces shown in FIGS. 7 and 8 offer evidence of such grain boundary curvature.

In an effort to reduce the pore drag effect and facilitate the grain boundary migration of the single crystal, fully dense PMN-35 mol % PT powder compacts were produced by hot-pressing. In both the embedded seed and top-seeded growth techniques, the grown single crystals exhibited a significant reduction in porosity compared to crystals grown under pressureless conditions.

The following sets forth an example upon which a wefting second phase affected the annealing step to aid in single crystal growth. Powder of relaxor-based ferroelectric PMN-35% PT with an average particle size of 0.2 to 1.2 μm was thoroughly mixed with 0–15 vol % powder of a second composition. The second component of the powder mixture was a ceramic material (for example, lead oxide, lead aluminate, etc) with a melting point lower than that of the major constituent (PMN-PT). It is envisioned that other lower melting point ceramics could be used. Seed single crystals of PMN-35% PT were embedded in the powder mixture and pressed to form a powder compact. In some cases, the seeded compacts were sintered to full density by hot-pressing (950° C., 20 MPa, 30 min).

Figure 9A:
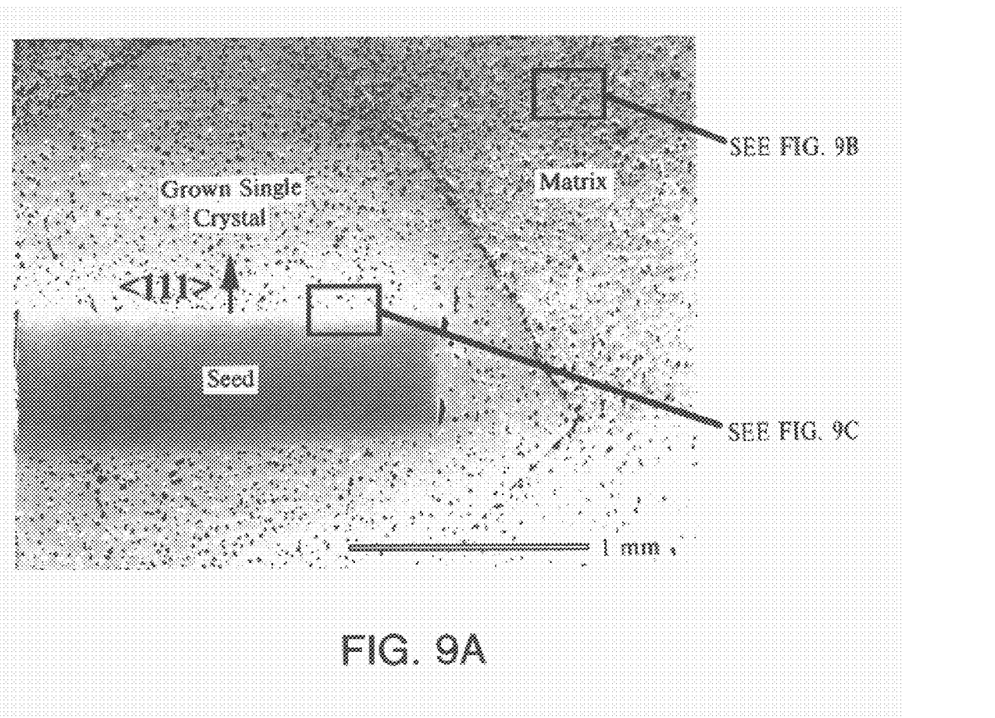
Figure 9B:
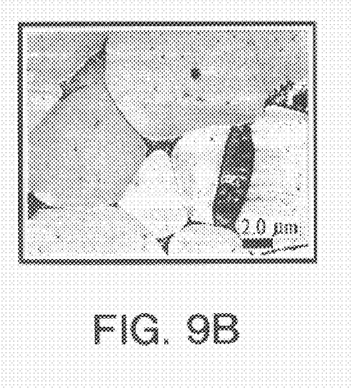
Figure 9C:
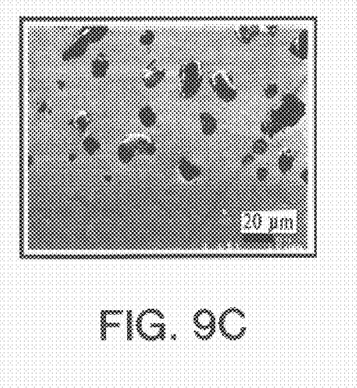
Figure 10:
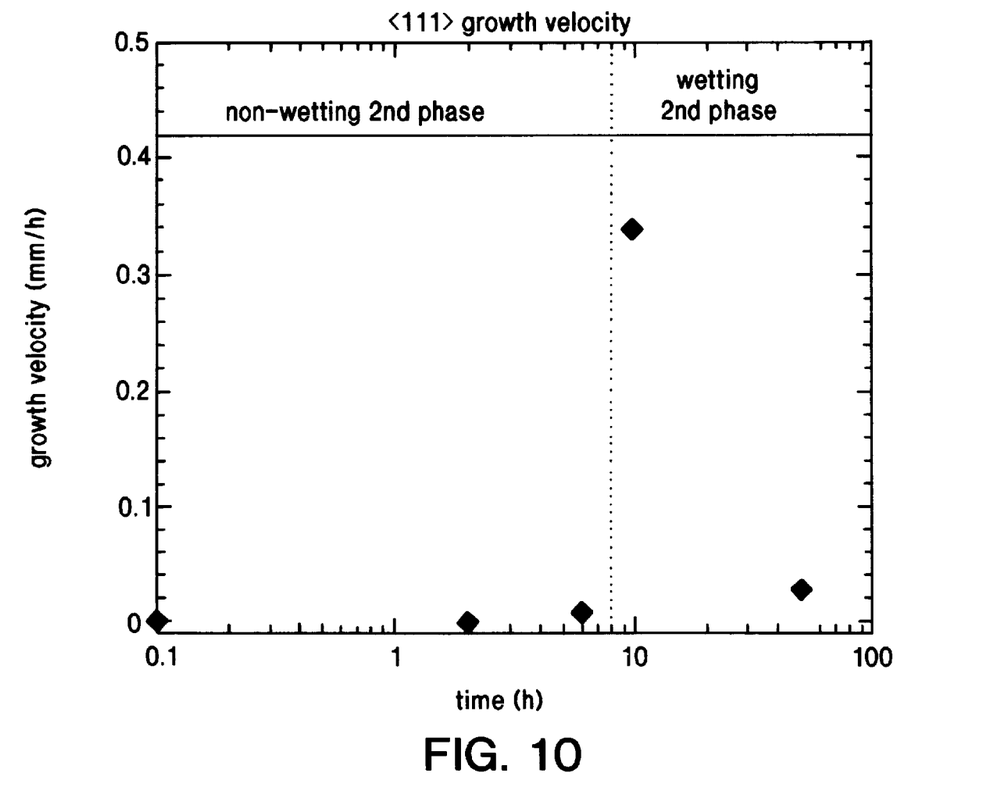
FIG. 10 is a graph showing the growth velocity of the single crystal boundary utilizing a wetting and non-wetting phase in the polycrystalline matrix.

The seeded compacts were then annealed at temperatures of 900–1200° C. for up to 50 hours in a closed crucible arrangement. The annealing takes place at a temperature which is below the melting point of PMN-PT, and which is above the melting point of the second component. The heat treatment triggered the seed single crystal to grow into the polycrystalline matrix under the influence of grain boundary curvature which is seen in FIG. 1. During the annealing stage, the minor constituent of the polycrystalline matrix (low melting point compound) forms a liquid phase throughout the PMN-PT polycrystalline matrix and around the seed. The presence of a small amount of this wetting second phase in the matrix and around the growing single crystal has been shown to aid the growth of the single crystal. The formation of the liquid phase is critical for the onset of rapid growth. FIGS. 9(a–c) shows a micrograph of a single crystal which has grown about 3 mm after annealing for only 10 hours at 1150° C. A higher magnification micrograph of the polycrystalline matrix shows the presence of a second phase which wets the boundaries of the matrix grains. FIG. 10 plots the growth velocity of the single crystal boundary as a function of annealing time. The growth velocity in the <111>direction increases significantly after 6 hours, then slows down again at much longer times. The large jump after 6 hours is due to the formation of a wetting second phase in the polycrystalline matrix. Slower single crystal growth was achieved at times below 6 hours, when the second phase was non-wetting.

The invention has been described with reference to particular preferred embodiments, but variation within the spirit and scope of the invention will occur to those skilled in the art.

We claim:

1. A method of forming a single crystal relaxor based material, comprising the steps of:
    a) providing a seed single crystal plate;
    b) providing a first and second polycrystalline structure;
    c) bonding the top surface of the seed crystal plate to the outer surface of the first polycrystalline structure;
    d) bonding the bottom surface of the seed crystal plate to the outer surface of the second polycrystalline structure; and
    e) annealing the bonded structure.

2. The method as defined in claim 1, wherein step c) takes place under pressureless conditions at a temperature between 900 and 1200° C.

3. A method of forming a single crystal, comprising the steps of
    a) providing seed single crystals;
    b) providing a polycrystalline structure comprising a first ceramic and a second ceramic, said second ceramic having a melting point lower than that of the first ceramic;
    c) embedding said seed crystals in the polycrystalline structure; and
    d) annealing said embedded structure at a temperature which is above the melting point of the second ceramic and below the melting point of the first ceramic.

4. The method as defined in claim 3, wherein the first ceramic is PMN-35% PT with an average particle size of about 0.2 to 1.2 microns, and the second ceramic is lead oxide or lead aluminate.

5. The method as defined in claim 4, wherein the second ceramic comprises up to 15% by volume of the composition of the polycrystalline structure.

6. The method as defined in claim 5 wherein step c) further comprises sintering the embedded structure.

7. The method as claimed in claim 6, wherein the annealing takes place at a temperature between 900–1200° C.

8. A method of forming a single crystal relaxor based ferroelectric, comprising the steps of:
    a) providing seed single crystals of a ferroelectric;
    b) providing a polycrystalline structure comprising a ferroelectric ceramic and a second ceramic, said ferroelectric having a melting point higher than that of the second ceramic;
    c) embedding said seed crystals in the polycrystalline structure; and
    d) annealing said embedded structure at a temperature which is above the melting point of the second ceramic and below the melting point of the ferroelectric.

* * * * *